United States Patent
Komatsu et al.

(10) Patent No.: US 8,159,245 B2
(45) Date of Patent: Apr. 17, 2012

(54) HOLDING MEMBER FOR INSPECTION, INSPECTION DEVICE AND INSPECTING METHOD

(75) Inventors: Shigekazu Komatsu, Yamanashi (JP); Mitsuyoshi Miyazono, Tokyo (JP); Kazuya Asaoka, Aichi (JP)

(73) Assignee: Tokyo Electron Limited, Tokyo (JP)

( * ) Notice: Subject to any disclaimer, the term of this patent is extended or adjusted under 35 U.S.C. 154(b) by 315 days.

(21) Appl. No.: 12/444,695

(22) PCT Filed: Oct. 17, 2007

(86) PCT No.: PCT/JP2007/070246
§ 371 (c)(1),
(2), (4) Date: Apr. 8, 2009

(87) PCT Pub. No.: WO2008/050648
PCT Pub. Date: May 2, 2008

(65) Prior Publication Data
US 2010/0033199 A1 Feb. 11, 2010

(30) Foreign Application Priority Data
Oct. 17, 2006 (JP) .................................. 2006-283015

(51) Int. Cl.
*G01R 31/20* (2006.01)
(52) U.S. Cl. ......... 324/754.01; 324/754.03; 324/754.27; 324/756.01
(58) Field of Classification Search ............. 324/754.08, 324/754.1
See application file for complete search history.

(56) References Cited

U.S. PATENT DOCUMENTS

| | | | | |
|---|---|---|---|---|
| 5,150,041 A | * | 9/1992 | Eastin et al. | 324/750.23 |
| 5,222,014 A | * | 6/1993 | Lin | 361/792 |
| 5,633,122 A | * | 5/1997 | Tuttle | 430/317 |
| 6,229,319 B1 | * | 5/2001 | Johnson | 324/754.09 |
| 6,486,686 B1 | * | 11/2002 | Fukasawa | 324/754.07 |
| 6,605,951 B1 | * | 8/2003 | Cowan | 324/754.08 |
| 6,759,860 B1 | * | 7/2004 | Hsiung et al. | 324/750.19 |
| 6,924,656 B2 | * | 8/2005 | Matsumoto | 324/750.19 |
| 7,148,718 B2 | * | 12/2006 | Hembree | 324/754.08 |
| 7,262,613 B2 | * | 8/2007 | Komatsu et al. | 324/754.03 |
| 7,262,615 B2 | * | 8/2007 | Cheng et al. | 324/756.05 |
| 7,425,839 B2 | * | 9/2008 | Stutzman et al. | 324/754.08 |

FOREIGN PATENT DOCUMENTS

JP 2006-208208 A 8/2006

OTHER PUBLICATIONS

International Search Report for PCT/JP2007/070246 dated Feb. 12, 2008.
International Preliminary Report on Patentability for PCT/JP2007/070246 dated Feb. 3, 2009.

* cited by examiner

*Primary Examiner* — Richard Isla Rodas
(74) *Attorney, Agent, or Firm* — Pearne & Gordon LLP

(57) ABSTRACT

Installed in a probe device is a holding member for inspection which can be mounted on a chuck. The holding member for inspection includes a support plate capable of mounting thereon a chip in which the power device is formed; pins for positioning the chip mounted on the support plate; and a metal film formed on a surface of the support plate in a range from a mounting area on which the chip is mounted to an exposed area on which the chip is not mounted. When inspecting the power device, the chip is fixed onto the mounting area in the holding member for inspection, one probe pin is brought into contact with a terminal on a top surface of the chip; and another probe pin is brought into contact with the metal film in the exposed area.

10 Claims, 5 Drawing Sheets

HOLDING MEMBER FOR INSPECTION, INSPECTION DEVICE AND INSPECTING METHOD

TECHNICAL FIELD

The present invention relates to a holding member for inspection, an inspection device and an inspecting method for inspecting electrical characteristics of a power device.

BACKGROUND ART

The electrical characteristics of a power device such as a power transistor, a power MOSFET (Metal-Oxide Semiconductor Field Effect Transistor), an IGBT (Insulated Gate Bipolar Transistor) or the like that has terminals on a top surface and a bottom surface thereof have been inspected by using a conventional inspection device.

The above-stated inspection device conventionally includes a chuck 100 for holding a substrate W of a power device, a probe card 102 disposed above the chuck 100 and supporting probe pins 101, and a tester 103 electrically connected with the probe card 102, as illustrated in FIG. 9. The power device has terminals on a top surface and a bottom surface of the substrate W, so that formed on a substrate holding surface of the chuck 100 are inspection electrodes 104 electrically connected with the tester 103 through an internal wiring 105 formed within the chuck 100 (see Patent Document 1).

In the inspection device, the electrical characteristics of the power device has been inspected by bring the probe pins 101 into contact with the terminal on the top surface of the power device, applying a voltage to the probe pins 101 and the inspection electrodes 104 by the tester 103, and flowing an electric current through the power device.

Patent Document 1: Japanese Patent Laid-open Publication No. H6-242177

DISCLOSURE OF THE INVENTION

Problems to be Solved by the Invention

However, in the above-stated inspection device, there is formed an electric current path from the inspection electrodes 104 to the tester 103 through the inside of the chuck 100 when the inspection is carried out, so that the electric current path is lengthened and complicated, thereby generating a high resistance or inductance. For this reason, various loads impeding the electrical current are applied to the electrical current path while being electrically conducted during the inspection, so that it has been difficult to stably carry out the inspection with a desired accuracy. In particular, in case of flowing a great electric current through the power device to perform a reliability test, there is generated a higher resistance or inductance in the electric current path, whereby it has been difficult to appropriately carry out a required inspection.

The present invention has been conceived in view of the foregoing, and an object of the present invention is to stably carry out a required inspection with a high accuracy when inspecting the electrical characteristics of the power device by forming the electric current path having a small load.

Means for Solving the Problems

In view of the foregoing, in accordance with one aspect of the present invention, there is provided a holding member for inspection for holding a power device when inspecting electrical characteristics of the power device having terminals on its top surface and bottom surface, the holding member including: a support plate for mounting thereon a chip in which the power device is formed; a positioning member for positioning the chip mounted on the support plate; and a metal film formed on a surface of the support plate in a range from an area on which the chip is mounted to an area on which the chip is not mounted, wherein the metal film in the area on which the chip is not mounted makes it possible to electrically conduct a probe pin with the terminal on the bottom surface of the power device when the probe pin is brought into contact with the metal film in the area on which the chip is not mounted.

In accordance with the present invention, by bringing one probe pin into contact with the top surface of the chip on the holding member for inspection and another probe pin into contact with the metal film on the surface of the holding member for inspection, it is possible to conduct the probe pins to the terminals on the top surface and the bottom surface of the power device. In this case, the electric current path formed during the inspection is shortened, so that a high resistance or inductance is not generated therein, thereby stably carrying out a desired inspection with a high accuracy.

The positioning member may be a plurality of pins or protrusions in contact with a side surface of the chip.

The positioning member may be a recessed portion capable of accommodating the chip and may be formed on the surface of the support plate, and the metal film may be formed in a range from a bottom surface of the recessed portion to an outer peripheral surface of an outside of the recessed portion.

The positioning member may be a recessed portion capable of accommodating the chip and may be formed on a surface of the metal film.

The holding member may further include a holding member another metal film insulated from the metal film and formed on the surface of the support plate in a range from an area on which the chip is mounted to an area on which the chip is not mounted.

A suction opening for sucking and holding the chip may be formed in the area on which the chip is mounted on the surface the support plate.

One or more suction opening may be formed, and the suction openings may be communicated with a common opening portion opened at a rear surface of the support plate.

The support plate may mount thereon a plurality of chips, and the positioning member and the metal film may be formed for each chip.

In accordance with another aspect of the present invention, there is provided an inspection device for inspecting electrical characteristics of a power device, including a holding member for inspection, the inspection device including: a top surface terminal probe pin which is in contact with a top surface of a chip held onto the holding member for inspection, and is electrically conducted with the terminal on the top surface of the power device; and a bottom surface terminal probe pin which is in contact with a metal film in an area on which the chip on the holding member for inspection is not mounted, and is electrically conducted with the terminal on the bottom surface of the power device.

The inspection device may further include a top surface terminal fritting probe pin making a pair with the top surface terminal probe pin, which is in contact with the terminal on the top surface of the power device together with the top surface terminal probe pin and electrically conducts the top surface terminal probe pin to the terminal on the top surface by utilizing a fritting phenomenon; and a bottom surface terminal fritting probe pin making a pair with the bottom surface terminal probe pin, which is in contact with the metal film together with the bottom surface terminal probe pin and electrically conducts the bottom surface terminal probe pin to the metal film by utilizing a fritting phenomenon.

In accordance with still another aspect of the present invention, there is provided an inspecting method for inspecting electrical characteristics of a power device by using an inspection device, the inspecting method including: bringing, from a top surface side of the holding member for inspection, the top surface terminal probe pin into contact with the top surface of the chip on the holding member for inspection; bringing the bottom surface terminal probe pin into contact with the metal film; applying a voltage to the terminals on the top surface and the bottom surface of the power device; and inspecting the electrical characteristics.

A bottom surface terminal fritting probe pin may be brought into contact with the terminal on the top surface of the power device together with the top surface terminal probe pin and the top surface terminal probe pin may be electrically conducted with the terminal on the top surface by utilizing a fritting phenomenon, and a bottom surface terminal fritting probe pin may be brought into contact with the metal film together with the bottom surface terminal probe pin and the bottom surface terminal probe pin may be electrically conducted with the metal film by utilizing a fritting phenomenon.

Effect of the Invention

In accordance with the present invention, it is possible to stably carry out a required inspection with a high accuracy by forming an electric current path having a small electric load during the inspection.

EXPLANATION OF CODES

Figure 1:
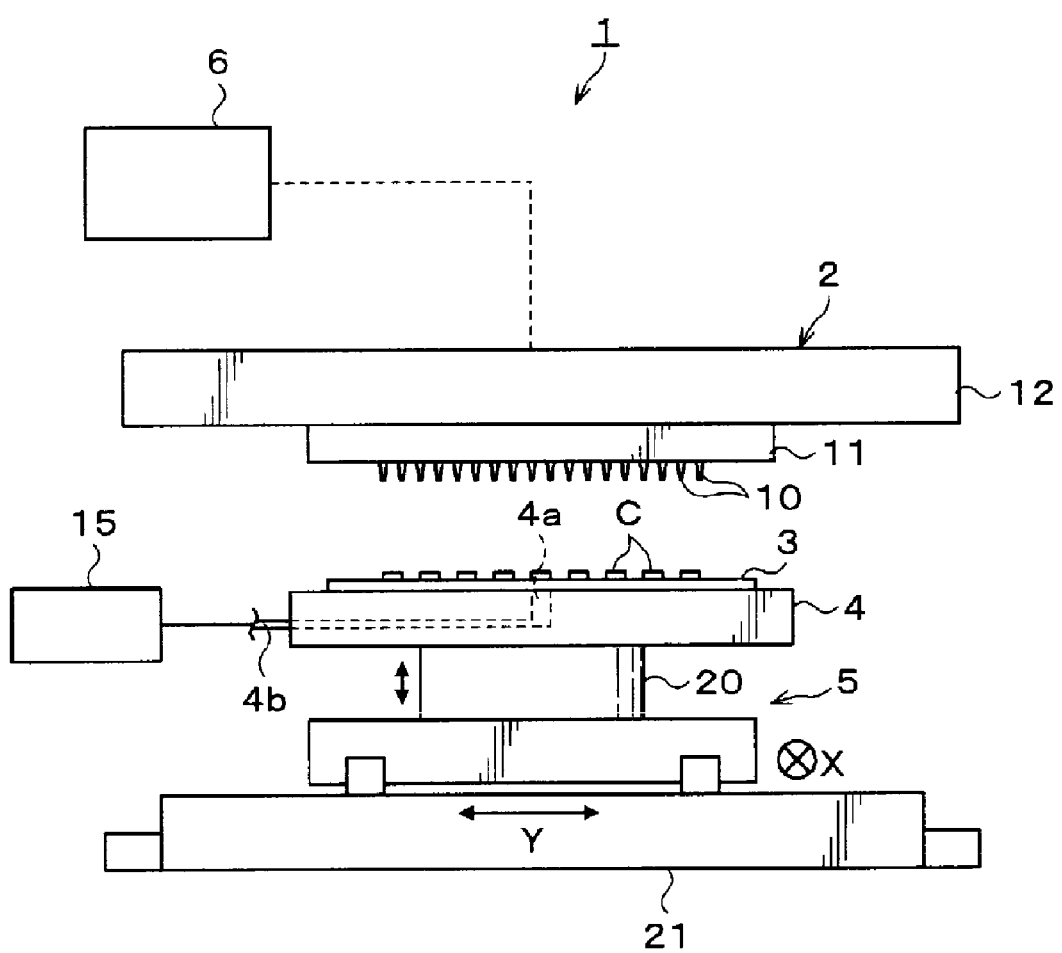
FIG. 1 is a side view schematically illustrating a configuration of a probe device.

1: probe device
2: probe card
3: holding member for inspection
4: chuck
6: tester
10: probe pins
30: support plate
40: first metal film
41: second metal film
42: pins
43: suction opening
P: power device
C: chip

BEST MODE FOR CARRYING OUT THE INVENTION

Hereinafter, desirable embodiments of the present invention will be explained. FIG. 1 is an explanatory view schematically illustrating a structure of a probe device 1 serving as an inspection device in accordance with the present embodiment.

The probe device 1 includes, for example, a probe card 2, a holding member 3 for inspection for holding chips C in which a power device is fabricated, a chuck 4 for adsorptively holding the holding member 3 for inspection, a moving mechanism 5 for moving the chuck 4, a tester 6 and the like.

The probe card 2 includes, for example, a contactor 11 for supporting a plurality of probe pins 10 on its bottom surface and a printed circuit board 12 installed on a top surface of the contactor 11. The probe pins 10 are electrically connected with the printed circuit board 12 through a main body of the contactor 11. Electrically connected with the probe card 2 is the tester 6 from which electrical signals for inspecting electrical characteristics can be transceived to each of the probe pins 10 through the probe card 2.

The chuck 4 is formed in an approximately disc shape having a flat top surface. Formed in the top surface of the chuck 4 is a suction opening 4a for adsorptively holding the holding member 3 for inspection. The suction opening 4a is connected with a suction line 4b which is connected with an external negative pressure generator 15, passing through the inside of the chuck 4, for example.

The moving mechanism 5, as illustrated in FIG. 1, includes an elevation driving unit 20 such as a cylinder for elevating, e.g., the chuck 4 up and down and an X-Y stage 21 for moving the elevation driving unit 20 in both of the horizontal orthogonal X and Y directions, whereby the holding member 3 for inspection held on the chuck 4 can be three-dimensionally moved and a certain probe pin 10 disposed above can be brought into contact with a predetermined position on a surface of the holding member 3 for inspection.

Figure 2:
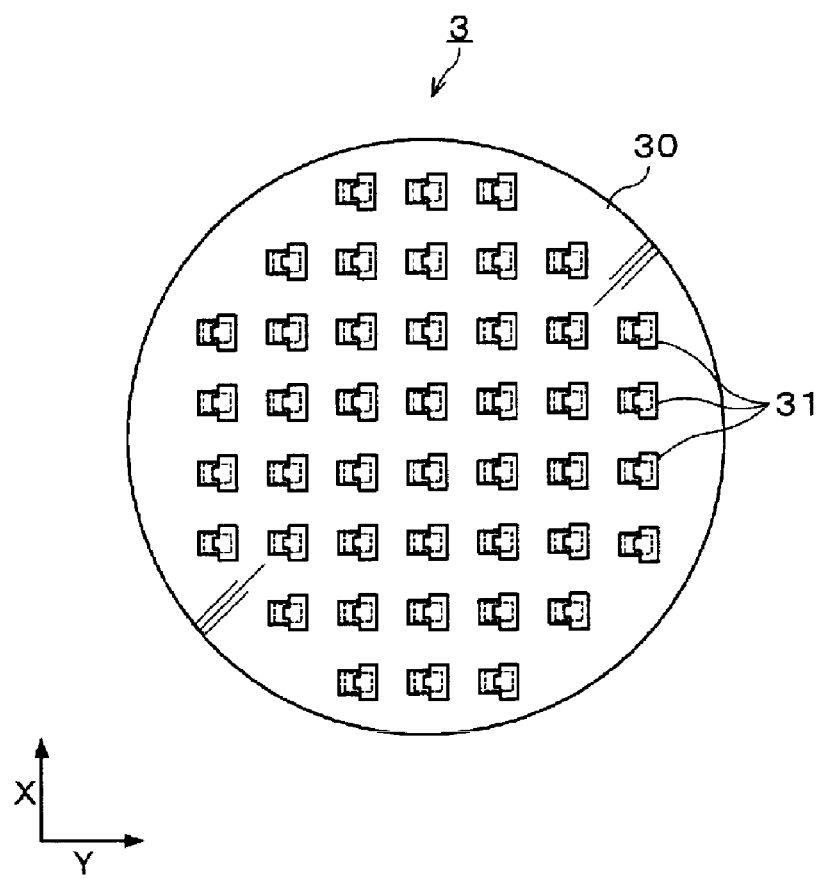
FIG. 2 is a plane view of a holding member for inspection.

The holding member 3 for inspection adsorptively held on the chuck 4 includes a support plate 30 having a thin disc shape with a thickness of about 1.5 mm and there is formed a plurality of chip mounting units 31 on a surface of the support plate 30 as illustrated in FIG. 2, for example. The support plate 30 is made of, e.g., ceramic. The chip mounting units 31 are aligned on the surface of the support plate 30 in X and Y directions, for example.

Figure 3:
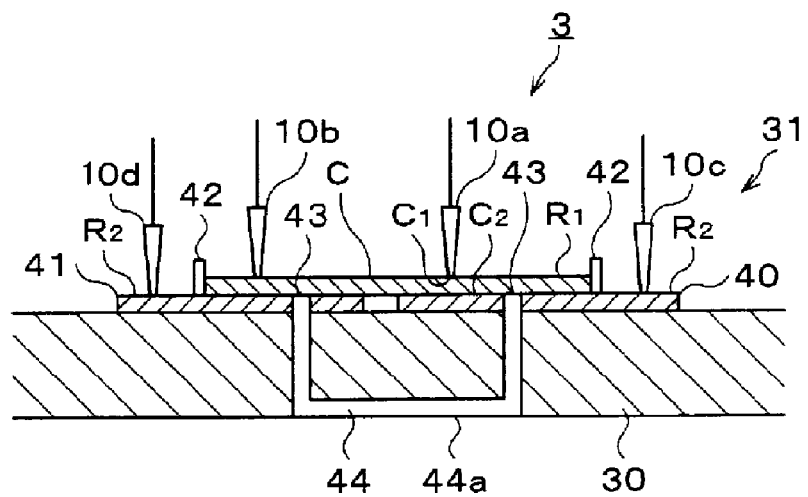
FIG. 3 is an enlarged longitudinal cross section view showing a chip mounting unit of the holding member for inspection.
Figure 4:
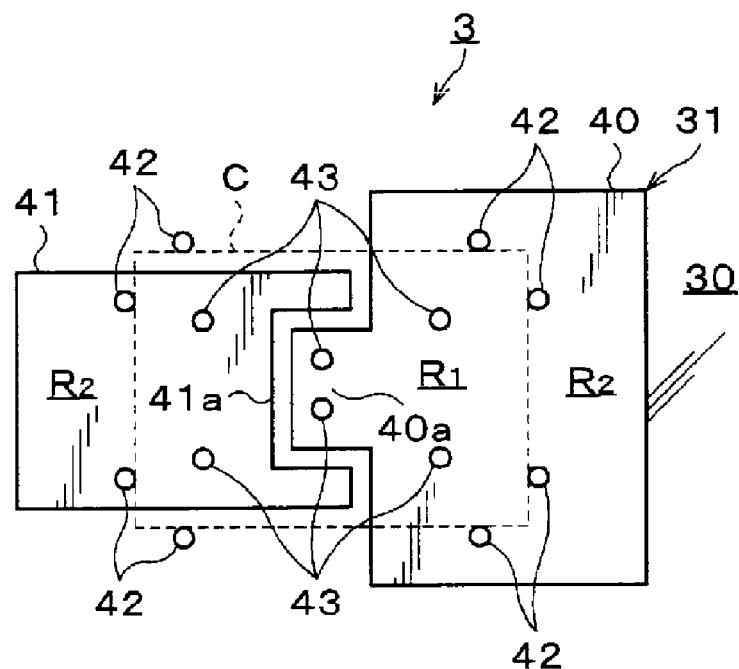
FIG. 4 is an enlarged plane view showing the chip mounting unit of the holding member for inspection.

In the respective chip mounting units 31, as illustrated in FIGS. 3 and 4, for example, there are formed thin metal films 40 and 41 which are separated and insulated from each other. The metal films 40 and 41 are formed to have a multilayer structure composed of, e.g., copper, nickel, silver and gold and to have the same thickness of, e.g., about 0.1 mm.

A first metal film 40 has an approximately quadrangle shape in a plane view as illustrated in FIG. 4, and has a protruded portion 40a on its one surface at the side of a second metal film 41. Further, the second metal film 41 as another metal film has an approximately quadrangle shape in a plane view and has a recessed portion 41a on its one surface at the side of the first metal film 40. The protruded portion 40a of the first metal film 40 and the recessed portion 41a of the second metal film 41 are formed to be engaged with each other. A chip C is mounted over from a part of the first metal film 40 to a part of the second metal film 41. That is, the first metal film 40 and the second metal film 41 are formed in a range from a mounting area R1, on which the chip C is mounted, to an exposed area R2 on which the chip C is not mounted, i.e., outside of the chip C.

A plurality of pins 42 for positioning the chip C by being brought into contact with a side surface of the chip C is set up on each chip mounting table 31. The pins 42 are arranged along an outer periphery of the mounting area R1 on which the chip C is mounted.

Further, formed in each chip mounting unit 31 is a plurality of suction openings 43. The suction openings 43 are formed in both of the first metal film 40 and the second metal film 41. Each of the suction openings 43 is communicated with a common bypass suction line 44 which is formed within the support plate 30 as illustrated in FIG. 3, for example. The bypass suction line 44 is opened in a rear surface of the support plate 30 at a position corresponding to the suction opening 4a of the chuck 4 (opening portion 44a). When the holding member 3 for inspection is mounted on the chuck 4, the opening portion 44a of the bypass suction line 44 and the suction opening 4a in top surface of the chuck 4 are intercommunicated with each other, whereby the chip C is adsorptively held on the surface of the holding member 3 for inspection by a suction from the suction opening 4a of the chuck 4.

Figure 5:
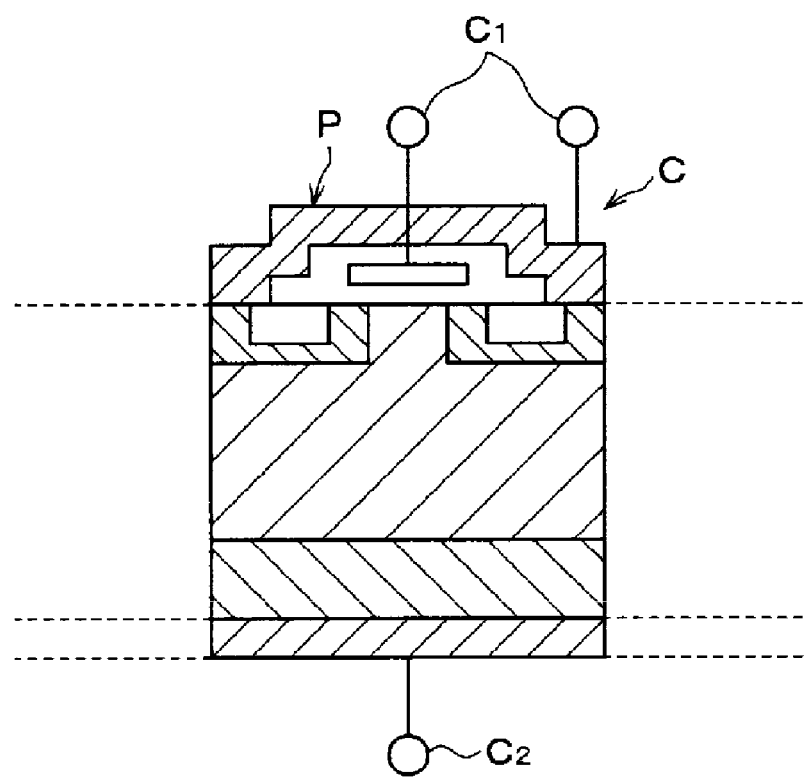
FIG. 5 is an explanatory view showing an example of a configuration of a power device.

Hereinafter, there will be explained a method of inspecting electrical characteristics of a power device in the probe device 1 configured as stated above. A power device P in accordance with the present embodiment includes a top surface terminal C1 such as a gate, a source or an emitter on a top surface of the chip C and a bottom surface terminal C2 such as a drain or a collector on a bottom surface of the chip C as illustrated in FIG. 5, for example.

First, a plurality of chips C are mounted on the respective chip mounting units 31 of the holding member 3 for inspection as illustrated in FIG. 3. At this time, the chip C is positioned by the pins 42 of each chip mounting unit 31. Subsequently, the holding member 3 for inspection is adsorptively held on the chuck 4 as illustrated in FIG. 1. At this time, the chip C is sucked and fixed from the suction openings 43 of each chip mounting unit 31 by the sucking force of the chuck 4. Then, the chuck 4 is moved by the moving mechanism 5 in a horizontal direction so as to adjust the position of the chip C in the X and Y directions and then the chuck 4 is elevated upward. In this manner, as illustrated in FIG. 3, for example, probe pins 10a and 10b are brought into contact with the top surface terminal C1 of the chip C and a probe pin 10c is brought into contact with a surface of the first metal film 40 in the exposed area R2 on which the chip C is not mounted. Further, a probe pin 10d is brought into contact with a surface of the second metal film 41 in the exposed area R2. Furthermore, in the present embodiment, the probe pin 10a serves as a probe pin for the top surface terminal and the probe pin 10c serves as a probe pin for the bottom surface terminal.

Moreover, a high voltage is applied between the probe pins 10a and 10c, for example, by the tester 6, an electric current flows from the probe pin 10a, the top surface terminal C1, the bottom surface terminal C2, the first metal film 40 and the probe pin 10c in sequence, and there is conducted, e.g., a withstand voltage test of the power device P. Further, a voltage between the probe pin 10b and the probe pin 10d is measured by a non-illustrated monitor in the tester 6 so that a voltage actually applied onto the power device P during the inspection is measured. By measuring the actually applied voltage, it is possible to apply an appropriate load to the device in consideration of electrical loss caused by a contact resistance. In this manner, electrical characteristics of the power device P are inspected by using a four-terminal Kelvin measurement method.

Upon completion of the inspection of electrical characteristics, the chuck 4 is elevated downward by the moving mechanism 5 and the respective probe pins 10 are spaced from the chip C. Thereafter, the holding member 3 for inspection is separated from the chuck 4 and a series of the inspection process is finished.

In accordance with the above-described embodiment, the plurality of chip mounting units 31 is formed on the support plate 30 of the holding member 3 for inspection and on the surface of each chip mounting unit 31, the first metal film 40 is formed in a range from the mounting area R1, on which the chip C is mounted, to the exposed area R2 on which the chip C is not mounted. With this configuration, by brining one probe pin 10a into contact with the top surface terminal C1 of the chip C and another probe pin 10c into contact with the first metal film 40 in the exposed area R2, it is possible to apply a voltage between the top surface terminal C1 and the bottom surface terminal C2 of the power device P and to inspect the electrical characteristics of the power device P. In this case, since an electric current path is short from the bottom surface terminal C2 of the power device P to the probe pin 10c so that it is possible to form the electric current path having a small load between the tester 6 and the power device P during the inspection, a required inspection can be stably carried out with a high accuracy.

The pins 42 are formed on each chip mounting unit 31 so as to improve the positioning accuracy of the chip C, so that it is possible to carry out the inspection of the micro chip C with a high accuracy. Further, on the chip mounting unit 31, it may be possible to form protrusions made of resin or metal by a printing method or an etching method instead of the pins 42.

Formed on each chip mounting unit 31 is the second metal film 41 insulated from the first metal film 40, so that it is possible to bring one probe pin 10b into contact with the top surface terminal C1 of the chip C and another probe pin 10d into contact with the second metal film 41 in the exposed area R2 on which the chip C is not mounted during the inspection. In this manner, by measuring the voltage actually applied to the power device P, it can be checked that the inspection is appropriately carried out by the tester 6.

Since the suction openings 43 are formed on each chip mounting unit 31, the chip C can be fixed onto the chip mounting unit 31. Further, the suction openings 43 are communicated with the common opening portion 44a in the rear surface of the support plate 30, so that the chip C can be adsorptively held onto the holding member 3 for inspection by suction from, e.g., the suction opening 4a of the chuck 4.

Figure 6:
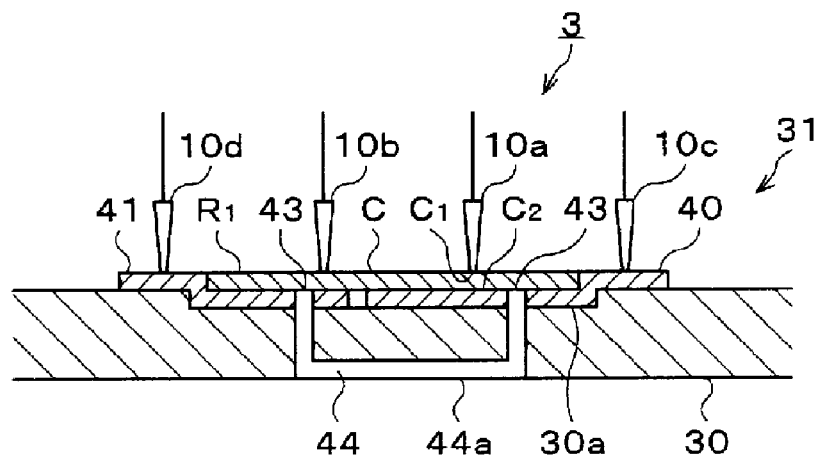
FIG. 6 is an enlarged longitudinal cross section view of the chip mounting unit of the holding member for inspection in case of forming a recessed portion in a support plate.

In the above-stated embodiments, though the chip C is positioned by the pins 42, it may be also possible to form a recessed portion 30a capable of accommodating the chip C on the surface of the support plate 30 and to position the chip C by the recessed portion 30a, as illustrated in FIG. 6. In this case, the recessed portion 30a having approximately the same shape as the chip C is formed in the mounting area R1 of the support plate 30, for example. The first and second metal films 40 and 41 are formed respectively in a range including a bottom surface of the recessed portion 30a, an inner side surface of the recessed portion 30a and an outer peripheral surface of the outside of the recessed portion 30a. A depth of the recessed portion 30a is set so that, for example, the top surface of the chip C accommodated in the recessed portion 30a is on the same plane with the outer peripheral surface of the outside of the recessed portion 30a. While inspecting the power device P, the chip C is accommodated in the recessed portion 30a, for example, the probe pins 10a and 10b are in contact with the top surface of the chip C; the probe pin 10c is in contact with the first metal film 40 in the outer peripheral surface of the recessed portion 30a; and the probe pin 10d is in contact with the second metal film 41 in the outer peripheral surface of the recessed portion 30a. In this case too, the chip C is positioned at an appropriate position, thereby improving positional accuracy of the chip C, so that it is possible to carry out the inspection of the micro chip C with a high accuracy.

Figure 7:
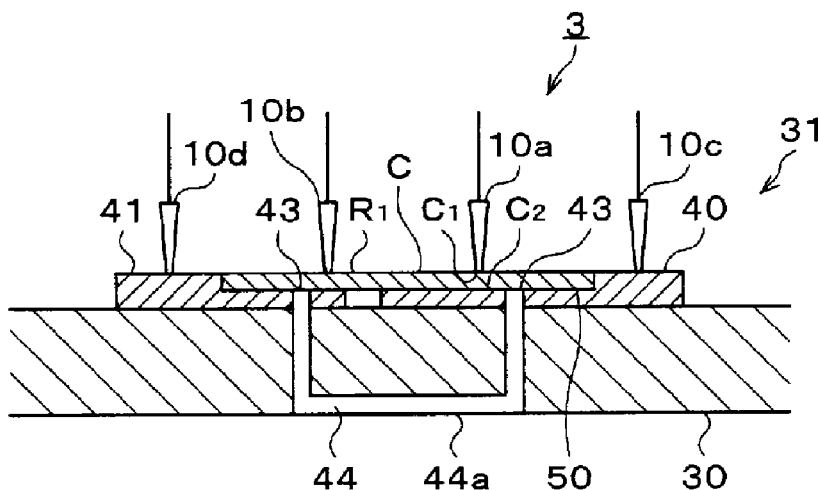
FIG. 7 is an enlarged longitudinal cross section view of the chip mounting unit of the holding member for inspection in case of forming a recessed portion in a metal film.
Figure 8:
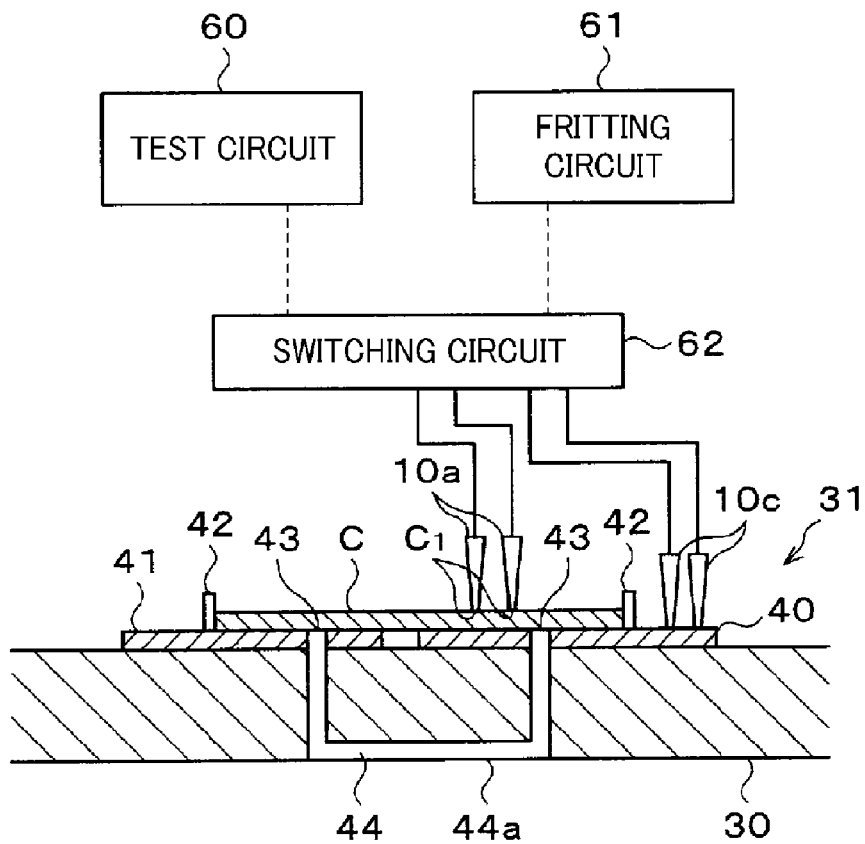
FIG. 8 is an explanatory view illustrating a circuit configuration when utilizing a fritting phenomenon.
Figure 9:
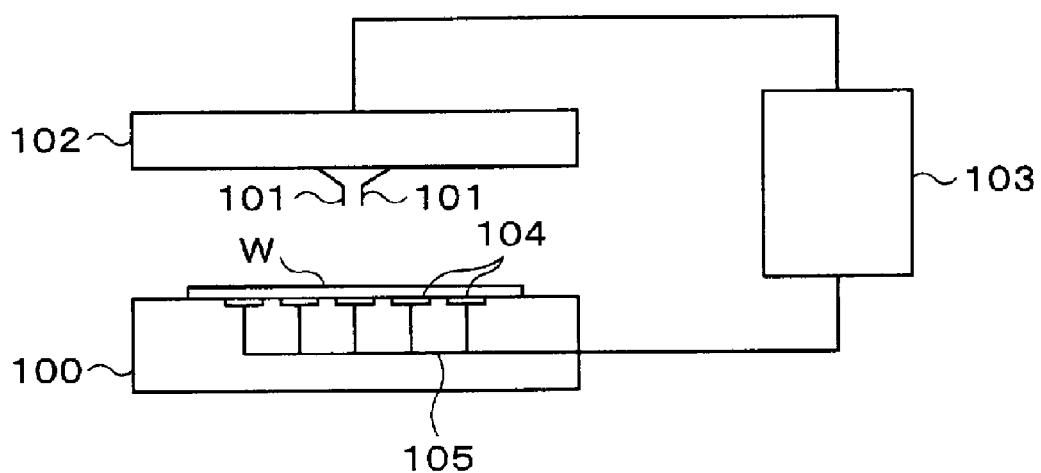
FIG. 9 is a schematic diagram showing a configuration of an inspection device of a conventional power device.

Furthermore, as illustrated in FIG. 7, it is also possible to position the chip C by forming a recessed portion 50 capable of accommodating the chip C on the surfaces of the first and second metal films 40 and 41. In this case, the recessed portion 50 is formed on a surface of the mounting area R1 of the first metal film 40 and the second metal film 41. By this way too, the positional accuracy of the chip C can be improved, so that it is possible to carry out the inspection of the micro chip C with a high accuracy.

By utilizing a fritting phenomenon, it may be possible to inspect the electrical characteristics by using the probe pins 10 as stated in the above embodiments. Further, the fritting phenomenon is such a phenomenon as follows. By applying a potential gradient of about $10^5$ to $10^6$ V/cm to a metal surface on which an oxide film is formed, the oxide film is broken down and a current flows in the metal surface.

In this case, formed in the printed circuit board 12 are: a test circuit 60 for transceiving electrical signals for inspecting electrical characteristics to or from the probe pins 10; a fritting circuit 61 for applying a voltage to a pair of two probe pins 10 so as to generate the fritting phenomenon; and a switching circuit 62 for switching a connection between the test circuit 60 and the probe pins 10 to a connection between the fritting circuit 61 and the probe pins 10, for example.

Moreover, when inspecting the power device P, a pair of two probe pins 10a are in contact with the top surface terminal C1 of the chip C, for example; and another pair of two probe pins 10c are in contact with the first metal film 40 in the exposed area R2 of the outside of the chip C. The fritting circuit 61 applies a predetermined voltage between the pair of two probe pins 10a(10c), whereby the potential gradient between the pair of two probe pins 10a(10c) is increased. By this way, there occurs a dielectric breakdown in the oxide film on each of the top surface terminal C1 of the chip C and the first metal film 40 and there are electrically conducted between the top surface terminal C1 and the probe pins 10a and between the first metal film 40 and the probe pins 10c. Thereafter, the fritting circuit 61 is switched to the test circuit 60 by the switching circuit 62; the voltage is applied between the top surface terminal C1 of the chip C and the first metal film 40 by, e.g., the two pairs of the probe pins 10a and 10c; and an inspection of electrical characteristics of the power device P is carried out in the same manner as in the above-stated embodiment. In this case, it may be possible to form a desired electric current path generated by a fritting phenomenon by using plural pairs of the probe pins 10a and 10c and then to perform a great current test by connecting all these probe pins with the test circuit 60. Furthermore, in the present embodiment, for example, one of the probe pins 10a serves as a fritting probe pin for the top surface terminal and one of the probe pins 10c serves as a fritting probe pin for the bottom surface terminal.

Further, in this case, the probe pins 10 are electrically conducted with the top surface terminal C or with the first metal film 40 by utilizing the fritting phenomenon, so that it is not needed to heavily press down the probe pins 10 onto the top surface terminal C or the first metal film 40 and damage in the holding member 3 for inspection caused by such a press can be reduced. As a result, for example, the holding member 3 for inspection can be used many times for a long time.

The above description of the present invention is provided for the purpose of illustration, and it would be understood by those skilled in the art that various changes and modifications may be made without changing technical conception and essential features of the present invention. Thus, it is clear that the above-described embodiments are illustrative in all aspects and do not limit the present invention.

INDUSTRIAL APPLICABILITY

The present invention is useful to an inspection of electrical characteristics of a power device when a required inspection should be stably carried out with a high accuracy by forming an electric current path having a small load.

What is claimed is:

1. An inspection device for inspecting electrical characteristics of a power device having terminals on its top surface and bottom surface, the inspection device comprising:
    a support plate for mounting thereon a chip in which the power device is formed;
    a positioning member for positioning the chip mounted on the support plate;
    a metal film formed on a surface of the support plate in a range from an area on which the chip is mounted to an area on which the chip is not mounted;
    a probe pin configured to be brought into contact with the metal film in the area on which the chip is not mounted; and
    a fritting probe pin making a pair with the probe pin, which is in contact with the metal film together with the probe pin and electrically conducts the probe pin to the metal film by utilizing a fitting phenomenon,
    wherein the metal film in the area on which the chip is not mounted makes it possible to electrically conduct the probe pin with the terminal on the bottom surface of the power device when the probe pin is brought into contact with the metal film in the area on which the chip is not mounted.

2. The inspection device of claim 1, wherein the positioning member is a plurality of pins or protrusions in contact with a side surface of the chip.

3. The inspection device of claim 1, wherein the positioning member is a recessed portion capable of accommodating the chip and is formed on the surface of the support plate, and the metal film is formed in a range from a bottom surface of the recessed portion to an outer peripheral surface of an outside of the recessed portion.

4. The inspection device of claim 1, wherein the positioning member is a recessed portion capable of accommodating the chip and is formed on a surface of the metal film.

5. The inspection device of claim 1, further comprising:
    another metal film insulated from the metal film and formed on the surface of the support plate in a range from an area on which the chip is mounted to an area on which the chip is not mounted.

6. The inspection device of claim 1, wherein at least one suction opening for sucking and holding the chip is formed in the area on which the chip is mounted on the surface the support plate.

7. The inspection device of claim 6, wherein the at least one suction opening is plural in number, and
    each of the at least one suction opening communicates with a common opening portion opened at a rear surface of the support plate.

8. The inspection device of claim 1, wherein the support plate mounts thereon a plurality of chips, and
the positioning member and the metal film are formed for each chip.

9. An inspection device for inspecting electrical characteristics of a power device, including a holding member for inspection for holding the power device when inspecting the electrical characteristics of the power device having terminals on its top surface and bottom surface, the inspection device comprising:
a top surface terminal probe pin which is in contact with a top surface of a chip held onto the holding member for inspection, and is electrically conducted with the terminal on the top surface of the power device;
a bottom surface terminal probe pin which is in contact with a metal film in an area on which the chip on the holding member for inspection is not mounted, and is electrically conducted with the terminal on the bottom surface of the power device;
a top surface terminal fritting probe pin making a pair with the top surface terminal probe pin, which is in contact with the terminal on the top surface of the power device together with the top surface terminal probe pin and electrically conducts the top surface terminal probe pin to the terminal on the top surface by utilizing a fritting phenomenon; and
a bottom surface terminal fritting probe pin making a pair with the bottom surface terminal probe pin, which is in contact with the metal film together with the bottom surface terminal probe pin and electrically conducts the bottom surface terminal probe pin to the metal film by utilizing a fritting phenomenon,
wherein the holding member for inspection includes:
a support plate for mounting thereon the chip in which the power device is formed;
a positioning member for positioning the chip mounted on the support plate; and
the metal film formed on a surface of the support plate in a range from an area on which the chip is mounted to the area on which the chip is not mounted.

10. An inspecting method for inspecting electrical characteristics of a power device by using an inspection device, wherein the inspection device inspects the electrical characteristics of the power device and includes a holding member for inspection for holding the power device when inspecting the electrical characteristics of the power device having terminals on its top surface and bottom surface, the inspection device comprising:
a top surface terminal probe pin which is in contact with a top surface of a chip held onto the holding member for inspection, and is electrically conducted with the terminal on the top surface of the power device; and
a bottom surface terminal probe pin which is in contact with a metal film in an area on which the chip on the holding member for inspection is not mounted, and is electrically conducted with the terminal on the bottom surface of the power device,
wherein the holding member for inspection includes:
a support plate for mounting thereon the chip in which the power device is formed;
a positioning member for positioning the chip mounted on the support plate; and
the metal film formed on a surface of the support plate in a range from an area on which the chip is mounted to the area on which the chip is not mounted,
wherein the inspecting method brings, from a top surface side of the holding member for inspection, the top surface terminal probe pin into contact with the top surface of the chip on the holding member for inspection; brings the bottom surface terminal probe pin into contact with the metal film; applies a voltage to the terminals on the top surface and the bottom surface of the power device; and inspects the electrical characteristics,
a top surface terminal fritting probe pin is brought into contact with the terminal on the top surface of the power device together with the top surface terminal probe pin and the top surface terminal probe pin is electrically conducted with the terminal on the top surface by utilizing a fritting phenomenon, and
a bottom surface terminal fritting probe pin is brought into contact with the metal film together with the bottom surface terminal probe pin and the bottom surface terminal probe pin is electrically conducted with the metal film by utilizing a fritting phenomenon.

* * * * *

UNITED STATES PATENT AND TRADEMARK OFFICE
CERTIFICATE OF CORRECTION

| | | |
|---|---|---|
| PATENT NO. | : 8,159,245 B2 | Page 1 of 1 |
| APPLICATION NO. | : 12/444695 | |
| DATED | : April 17, 2012 | |
| INVENTOR(S) | : Shigekazu Komatsu et al. | |

It is certified that error appears in the above-identified patent and that said Letters Patent is hereby corrected as shown below:

In the Claims, column 8, line 35, please replace "fitting" with -- fritting --

Signed and Sealed this
Second Day of October, 2012

David J. Kappos
*Director of the United States Patent and Trademark Office*